(12) United States Patent
Kim

(10) Patent No.: US 7,098,643 B1
(45) Date of Patent: Aug. 29, 2006

(54) WIRE IDENTIFIER

(76) Inventor: Dae S. Kim, 49 Floral St., Newton, MA (US) 02461

(*) Notice: Subject to any disclaimer, the term of this patent is extended or adjusted under 35 U.S.C. 154(b) by 0 days.

(21) Appl. No.: 11/213,375

(22) Filed: Aug. 29, 2005

(51) Int. Cl.
G01R 19/00 (2006.01)
G01R 31/02 (2006.01)

(52) U.S. Cl. ............................. 324/66; 324/539
(58) Field of Classification Search ............ 324/66, 324/67, 764, 509, 527, 538, 539, 158.1; 379/9, 379/15.01, 25, 29.01; 338/227, 239, 319, 338/320
See application file for complete search history.

(56) References Cited

U.S. PATENT DOCUMENTS

| | | | | |
|---|---|---|---|---|
| 3,902,026 A | * | 8/1975 | Rogers et al. | 340/825.36 |
| 3,903,380 A | * | 9/1975 | Schomburg | 324/66 |
| 3,976,939 A | * | 8/1976 | Cruce et al. | 324/66 |
| 4,114,091 A | * | 9/1978 | Howard | 324/66 |
| 4,652,813 A | * | 3/1987 | Bakke et al. | 324/66 |
| 4,736,158 A | * | 4/1988 | McCartney | 324/66 |
| 4,837,488 A | * | 6/1989 | Donahue | 324/66 |
| 4,937,529 A | * | 6/1990 | O'Toole et al. | 324/66 |
| 5,565,784 A | * | 10/1996 | DeRenne | 324/527 |
| 6,750,643 B1 | * | 6/2004 | Hwang et al. | 324/66 |
| 2004/0000898 A1 | * | 1/2004 | Pool et al. | 324/66 |

* cited by examiner

Primary Examiner—Anjan Deb
Assistant Examiner—Hoai-An D. Nguyen

(57) ABSTRACT

A device and method for identifying each set of wire from a multiple of substantially identical sets of wires at the distributed end includes of a multiple of substantially identical resistors connected in series, metal wire holder connected to the each junctions and to the each ends and an electrically non-conducting housing with a multiple of openings for inserting wires to connect to each wire holder. The resistance between the first wire holder at one end and each successive wire holder increases in a finite step and corresponds to the markings on the housing. When all ground wires are connected to the first wire holder and each hot wire are connected the successive wire holders at the distributing end, the resistance between the ground wire and the hot wire identifies each set at the distributed end.

4 Claims, 1 Drawing Sheet

WIRE IDENTIFIER

BACKGROUND OF THE INVENTION

1. Field of the Invention

This invention relates to a device and method for identifying each set of wires among multiple of substantially identical sets of wires at the distributed ends.

2. Descriptions of the Prior Arts

During installation of electric service in a new building, renovation of electric wiring in an old building or installation of telephone wires for a residential or a small commercial building, an electrician connects a power source, sometimes, a vibrating buzzer, to a selected pair of wires at the central distributing end and then he identifies that particular pair at the distributed terminal end by detecting a light or sound, respectively.

Another method is simply to short a select pair of wire at one end and hunt for the pair at the other end with a portable power source and indicator such as a flash light with connecting clips. The time for traveling between two ends for repeating this process is minimized by two persons, one at each end, communicating, usually by shouting.

A telephone cable uses color-coded wires. Combinations of colors and spacing between the colored stripes can provide a large number of distinct wires in a bundle. However, in a small apartment or a large residential building, several identical sets of wires are used to distribute further to the individual rooms from the color-coded feed wires. Thus, it is necessary to identify each distributed set of wires at their terminals.

In prior arts, many improvements of above basic methods are found in US patents. They use improved power supplies, LED indicators and detectors, sophisticated wave forms for distinction and multiplexing, specially designed connectors, and network switching to perform part of tasks in the above basic methods. Most of these improvements are intended for communications and related wiring.

Bakker (4,652,813), McCartney (4,736,158) and Fields (4,937,519) proposed very complex voltage supply schemes, two separate sets of selector switches, and pulse generators, respectively. Fincher and Randall (5,847,557) proposed use of many LEDs as an indicators but the process still requires two persons. None of these improvements brought a simple, reliable and robust tool which an electrician can carry in his pocket and save time and money in his work.

SUMMARY OF THE INVENTION

This invention provides an efficient means for identifying each set of wires from a multiple of substantially identical sets of wires at the distributed end. This invention is particularly effective for minimizing time, labor, and mistake in installing residential or a small commercial electric service with less than two dozen circuit breakers.

This invention comprises of a multiple of substantially identical resistors connected in series, metal wire holding means connected to the each ends and to the each junctions between the neighboring resistors and an electrically non-conducting housing with the openings for inserting wires to connect to each corresponding wire holding means, which are always one more than the resistors. Thus, the resistances between the first wire holding means at one end to each successive wire holding means at the junctions and at the other end increases in a finite incremental step.

In this invention, the resistors are selected to have the first significant figure of one and the second significant figure of zero but their resistances are large enough not to be materially affected by added line resistance which is very low. Thus, the resistance reading at each successive wire holding means gives a consecutive natural numbers and corresponds to the markings, G, #1, #2, #3, and so on, on the housing. Readily available digital multi-meters and 2% resistors give required accuracy of first two digits.

At the distributing end of residential electric service, one connects all bare ground wires of three-wire lines into a single bundle and connects it to the first wire holding means marked G and connects the black wires to the successive wire holding means. In practice, the bare ground wires must be bundle for the final installation and all other wires should be stripped to expose about one half of inch from the ends to connect to circuit breakers or common ground lugs prior to installation. Thus, no extra preparation is required. When bare ground wires are not available in a two-wire system, simply bundle the ones with the same color, usually white, from each pair. Or bundle all wires except single test wire of the same color in case of multi-wire phone line.

At the distributed ends, if one simply reads the resistance between the ground wire and the black wire of a given set, the first two digits, or the nearest whole number, identify that particular line, which is shown by the corresponding marking. Naturally, a portable digital Ohm-meter and leads with alligator-clips are necessary for this task. When an Ohm-meter tends to read consistently low, one adds a small resistance to a lead wire.

Actually, this invention can identify two more sets of wires than the number of the resistors by connecting one black wire to ground, G, and the other one by leaving it open at the distributing end. At the distributed end, the first wire will read zero resistance and the other one, infinite. For identifying even larger sets of wires, one simply stacks more units of this invention and connects the last wire holder to G of next unit.

With this invention, one completes all installation at the distributed ends, records the number of each terminal and returns to the distributing end and transfers each black wire from this invention to the proper circuit breakers in the distributing box. Similarly, this invention identifies each outlet of an existing system by transferring the black wires of each circuit breaker to the wire holder and the ground wire to G of this invention at the distributing end and by reading the resistance between ground and each black wire of a given terminal at the distributed end.

With his invention, one can install many wires with least time and effort, alone.

BRIEF DESCRIPTION OF THE DRAWINGS

The present invention will be understood better by reading the following description and accompanying drawings, wherein.

BEST MODE FOR CARRYING OUT THIS INVENTION

Figure 1:
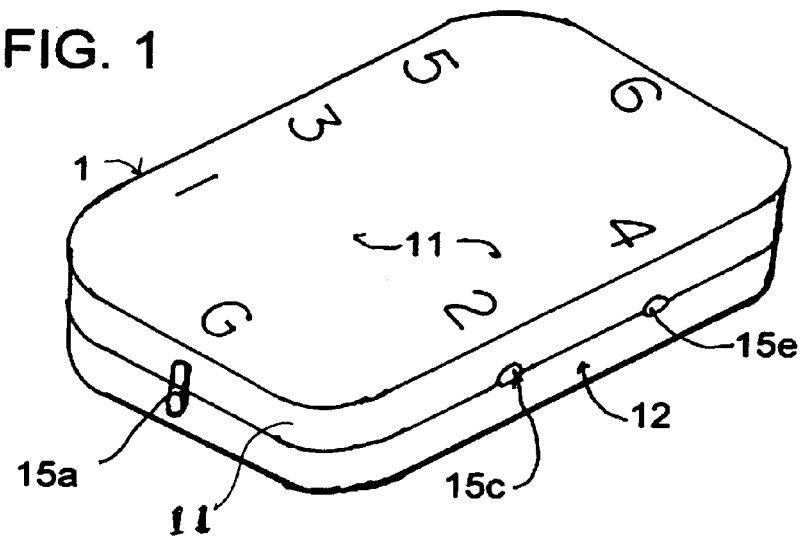
FIG. 1 is a perspective view of this invention.
Figure 2:
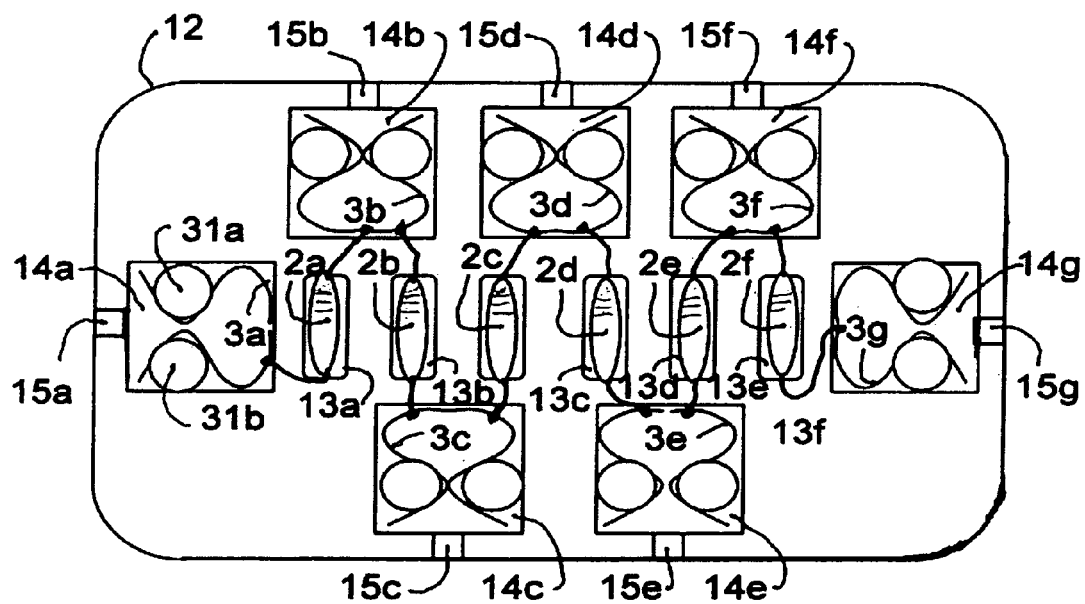
FIG. 2 is an enlarged sectional top view showing interior details.

In FIG. 1 and also FIG. 2, in detail, this invention comprises of an electrically insulated housing 1 which is formed by joining a pair of molded thermo-plastic clamshell halves 11 and 12, six substantially identical 10 K Ohm resistors, 2a, 2b, 2c, 2d, 2e and 2f, connected in series and seven metal wire holding means 3a to 3g, which are connected to two ends and five junctions between neighboring resistors.

The clam-shell halves 11 and 12 are identical and provide each halves of cavities 13a to 13f for resistors 2a to 2f and of larger cavities 14a to 14g for wire holding means 3a to 3g and openings 15a to 15g for inserting wires when joined. Both halves 11 and 12 are substantially rectangular and have smoothly rounded corners. The openings are sufficiently large to accommodate for ten gage wire which is largest in common use. However, two openings 15a and 15g located at the middle of the short sides of the housing 1 are elongated to hold an additional wire. The legs of the Omega-shaped wire holder face toward the opening and the narrow neck holds inserted wire securely. Although other suitable shapes of metal clips are available, this Omega shaped ones can be easily fabricated from a strip and reinforced elastically by inserting a pair of short poly-urethane plugs 31a and 31b which push the necks together. Each wire holding means and their corresponding openings are clearly identified by the marking G, and #1 to #6 on the exterior surface of housing 1.

To identify more than eight set of wires, one simply stacks another one of this invention, ties them together and connects the last wire holding means to G of the next unit, which handles additional six sets of wires. By adding more units, this invention can handle virtually unlimited sets of wires.

It is understood that the above description is given merely as illustration and not in limitation of the invention and that various modifications may be made thereto without departing from the spirit of the invention as claimed.

I claim:

1. A device for identifying each individual set of wires among multiple of substantially identical sets of wires at the distributed end comprising:

a) a set of substantially identical resistors connected in series;
   b) a set of wire holding means connected to each end of said series and to each junction between neighboring said resistors;
   c) an electrically non-conductive housing containing said resistors and said wire holding means, wherein said housing consisted of a pair of molded thermoplastic halves, which are identical and in mirror image of each other, joined to provide a multiple of substantially identical parallel cavities for holding said resistors in the middle part and substantially identical cavities for retaining said wire holding means around said parallel cavities, and a multiple of matching recesses on the joining edges of said halves forming a multiple of openings for inserting test wires to connect to said wire holding means and markings to identify each said wire holding means; and
   d) a portable Ohmmeter.

2. The device of claim 1 wherein said resistors have the first significant figure of one, the second significant figure of zero and sufficiently large resistance compared to the resistance of wire being tested so that the resistance reading corresponds to said markings and indicates the consecutive position in said series.

3. The device of claim 1 wherein said wire holding means are Omega shaped elastic sheet metal clips whose legs face toward said openings and narrow waists elastically hold inserted wire in place.

4. The device of claim 3 wherein a pair of matching Polyurethane plugs provides an additional elastic pressure to said waists and said inserted wires.

* * * * *